United States Patent
Tao et al.

(10) Patent No.: US 10,425,101 B1
(45) Date of Patent: Sep. 24, 2019

(54) BIPHASE MARK CODING TRANSCEIVER

(71) Applicant: LONTIUM SEMICONDUCTOR CORPORATION, Hefei (CN)

(72) Inventors: Cheng Tao, Hefei (CN); Xi Xu, Hefei (CN); Xiangyu Ji, Hefei (CN); Jiaxi Fu, Hefei (CN)

(73) Assignee: LONTIUM SEMICONDUCTOR CORPORATION, Hefei (CN)

( * ) Notice: Subject to any disclaimer, the term of this patent is extended or adjusted under 35 U.S.C. 154(b) by 0 days.

(21) Appl. No.: 16/049,890

(22) Filed: Jul. 31, 2018

(30) Foreign Application Priority Data

May 18, 2018 (CN) .......................... 2018 1 0478180

(51) Int. Cl.
*H03M 5/12* (2006.01)
*H03F 3/45* (2006.01)
*H04L 25/49* (2006.01)
*H04J 3/06* (2006.01)

(52) U.S. Cl.
CPC .......... *H03M 5/12* (2013.01); *H03F 3/45215* (2013.01); *H03F 3/45269* (2013.01); *H03F 3/45273* (2013.01); *H04J 3/0617* (2013.01); *H04L 25/4904* (2013.01); *H03F 2203/45156* (2013.01); *H03F 2203/45332* (2013.01)

(58) Field of Classification Search
CPC .. H03M 5/12; H03F 3/45273; H03F 3/45269; H03F 3/45215; H03F 2203/45332; H04L 25/4904; H04L 5/14; H04L 5/1423; H04L 5/16; H04J 3/0617; H04B 1/44; H04B 1/1615; H04B 1/406
USPC .......................................... 370/278, 282, 276
See application file for complete search history.

(56) References Cited

U.S. PATENT DOCUMENTS

| 6,351,189 B1 * | 2/2002 | Hirvilampi | ........... H03F 1/0261 330/296 |
| 2014/0038529 A1 * | 2/2014 | Adlerstein | ........... H04B 1/1607 455/73 |
| 2018/0351599 A1 * | 12/2018 | Shanjani | .................. H04B 1/44 |

* cited by examiner

*Primary Examiner* — Brenda H Pham
(74) *Attorney, Agent, or Firm* — Harness, Dickey & Pierce, P.L.C.

(57) ABSTRACT

A Biphase Mark Coding (BMC) transceiver is provided. In the BMC transceiver, an operational amplifier operating in a time division multiplexing manner is used. The operational amplifier is configured as a unity gain buffer, and it is determined whether the BMC transceiver operates as a transmitter or a receiver by selecting different input switches and output switches. In a transmitting mode, a bias current of an input differential pair transistor of the operational amplifier is changed, to change a slew rate, so as to obtain an output waveform with adjustable rising/falling edges of the transmitter.

6 Claims, 12 Drawing Sheets

USB Type-C Connector Interface

| Pin | Name | Description | | Name | Pin |
|-----|------|-------------|---|------|-----|
| A12 | GND | Ground | | GND | B1 |
| A11 | RX2+ | USB 3.1 RX2 Differential Pair | USB 3.1 TX2 Differential Pair | TX2+ | B2 |
| A10 | RX2− | | | TX2− | B3 |
| A9 | VBUS | USB Type-C Power | | VBUS | B4 |
| A8 | SBU1 | Sideband Use Channel-1 | Configuration Channel-2 | CC2 | B5 |
| A7 | D− | USB 2.0 Differential Pair | | D+ | B6 |
| A6 | D+ | | | D− | B7 |
| A5 | CC1 | Configuration Channel-1 | Sideband Use Channel-2 | SBU2 | B8 |
| A4 | VBUS | USB Type-C Power | | VBUS | B9 |
| A3 | TX1− | USB 3.1 TX1 Differential Pair | USB 3.1 RX1 Differential Pair | RX1− | B10 |
| A2 | TX1+ | | | RX1+ | B11 |
| A1 | GND | Ground | | GND | B12 |

Figure 14

| Pin | Name | Description | | Name | Pin |
|---|---|---|---|---|---|
| A1 | GND | Ground | | GND | B12 |
| A2 | TX1+ | USB 3.1 TX1 | USB 3.1 RX1 | RX1+ | B11 |
| A3 | TX1- | Differential Pair | Differential Pair | RX1- | B10 |
| A4 | VBUS | USB Type-C Power | | VBUS | B9 |
| A5 | CC | Configuration Channe | Sideband Use Channel-2 | SBU2 | B8 |
| A6 | D+ | USB 2.0 | N.C. | | B7 |
| A7 | D- | Differential Pair | | | B6 |
| A8 | SBU1 | Sideband Use Channel-1 | Power for Powered-Cable | VCONN | B5 |
| A9 | VBUS | USB Type-C Power | | VBUS | B4 |
| A10 | RX2- | USB 3.1 RX2 | USB 3.1 TX2 | TX2- | B3 |
| A11 | RX2+ | Differential Pair | Differential Pair | TX2+ | B2 |
| A12 | GND | Ground | | GND | B1 |

Figure 15

BIPHASE MARK CODING TRANSCEIVER

CROSS REFERENCE TO RELATED APPLICATION

The present application claims priority to Chinese Patent Application No. 201810478180.2, titled "BIPHASE MARK CODING TRANSCEIVER", filed on May 18, 2018 with the State Intellectual Property Office of People's Republic of China, which is incorporated herein by reference in its entirety.

FIELD

The present disclosure relates to the technical field of circuit design, and in particular to a Biphase Mark Coding (BMC) transceiver.

BACKGROUND

At present, Type-C, as an emerging universal serial bus (USB) interface standard, can provide a high data transmission speed, a high-power online power supply capability and a simple system connection under the support of the USB-PD protocol. In addition, Type-C can support simultaneous transmission of USB3.1 data and various video data including DisplayPort (DP), High Definition Multimedia Interface (HDMI) and Mobile High-Definition Link (MHL) and the like. According to the USB-PD specification, an upstream device communicates with a downstream device in the Type-C based on a Biphase Mark Coding (BMC) encoding mechanism through a configuration channel (CC). Rising edges or falling edges of a BMC-encoded transmission waveform are strictly specified in the USB-PD protocol. However, due to the uncertainty of parasitic parameters of a Type-C connection system, it is required that the rising or falling edges of the transmission waveform are adjustable, to ensure that the transmission waveform does not depend on the system connection property and conforms to the USB-PD specification.

Figure 1:
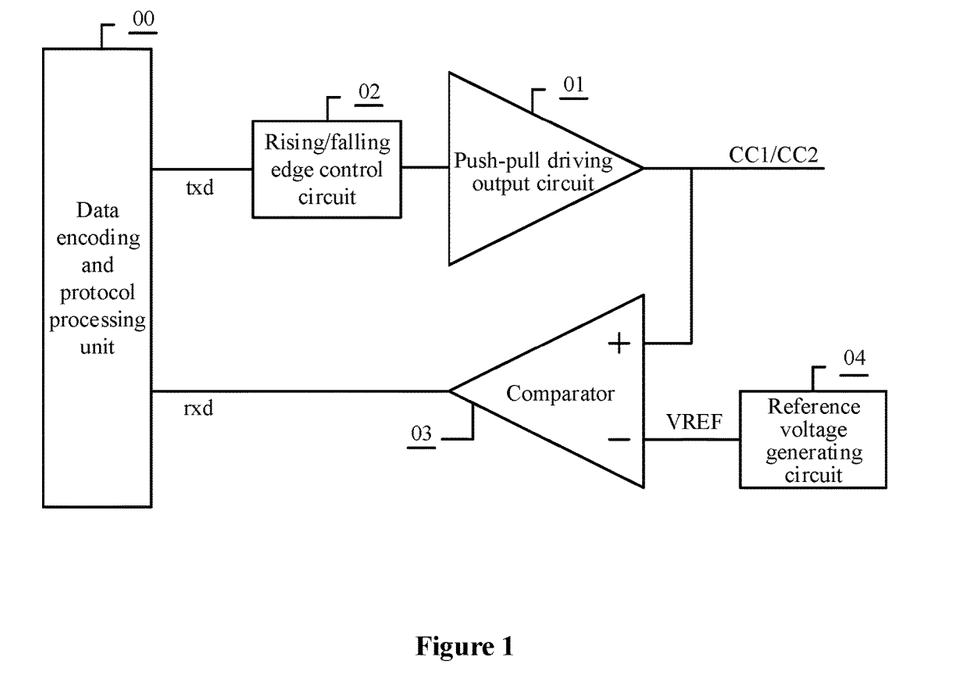
FIG. 1 is a schematic structural diagram of a conventional BMC transceiver according to the conventional technology.
Figure 2:
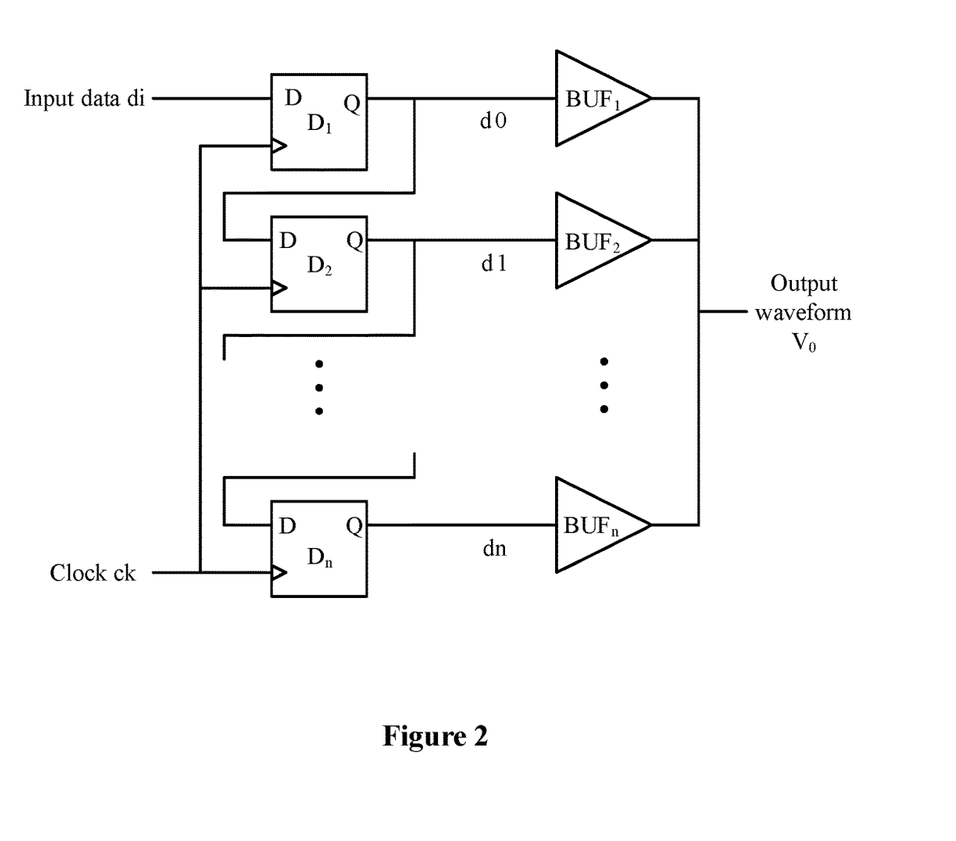
FIG. 2 is a schematic structural diagram of a conventional BMC transmitter according to the conventional technology.
Figure 3:
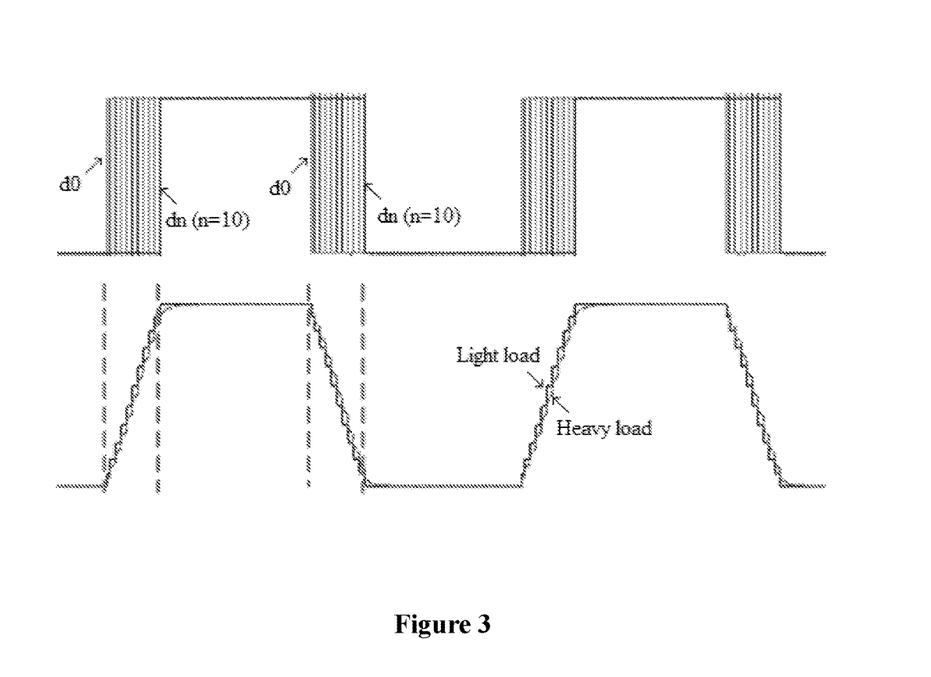
FIG. 3 is a schematic diagram showing a principle of an output waveform of a conventional BMC transmitter according to the conventional technology.

A conventional BMC transceiver includes two independent parts, that is, a BMC transmitter and a BMC receiver. As shown in FIG. 1, a schematic diagram of a conventional BMC transceiver is shown. A BMC transmitter of the BMC transceiver includes a push-pull driving output circuit 01 and a rising/falling edge control circuit 02. A BMC receiver of the BMC transceiver includes a comparator 03 and a reference voltage generating circuit 04. The push-pull driving output circuit 01 and the rising/falling edge control circuit 02 constitute a digital circuit, and the comparator 03 and the reference voltage generating circuit 04 constitute an analog circuit. Since the two circuits have different natures, and a power supply of the push-pull driving output circuit 01 and the rising/falling edge control circuit 02 has a large switching noise which may affect a comparison result of the comparator 03 and the reference voltage generating circuit 04, it is required to properly isolate the two circuits in a layout. In addition, in the conventional BMC transmitter, an architecture as shown in an example in FIG. 2 is adopted. FIG. 2 shows a conventional BMC transmitter with a controlled slew rate. Input data di is sampled by n stages of clocks to obtain signals d0 to dn with equal intervals (the interval refers to a clock period $T_{ck}$). Then, the signals d0 to dn are transmitted to the same number of buffers BUF, such that the n BUFs are successively driven to output a waveform with controlled rising/falling edges, as shown in an upper part of FIG. 3. The slew rate may be changed by changing the clock frequency, that is, the clock period $T_{ck}$. Waveforms under a light load and a heavy load are shown in a lower part of FIG. 3, it can be seen from the waveforms that there are obvious rising/falling edge steps, which are filtered out by a filter in an actual operation of the circuit; and a waveform with smooth rising/falling edges is finally obtained, as shown in the upper part of FIG. 3. However, the conventional BMC transceiver has the following disadvantages. First, the BMC transmitter is a digital circuit in nature, and the BMC receiver is an analog circuit in nature, it is required to isolate two circuits in a power supply and a ground to a certain degree, to prevent an interaction between power supply systems of the digital module and the analog module. Secondly, in the architecture adopted by the conventional BMC transmitter (as shown in FIG. 2), although the rising/falling edges are adjusted by means of multiple clocks with an equal interval phase or data sampled by multiple stages, these equal interval data or the clock drives digital buffers, which not only results in a large power supply switching noise, but also occupies a large chip area and consumes a large power.

SUMMARY

A novel BMC transceiver is provided according to the present disclosure, which has a low cost and a low power consumption, and is simple and easy to be realized. With the BMC transceiver, the following problems in the conventional technology can be solved. The conventional BMC transmitter and the conventional BMC receiver are different in circuit natures, resulting in that power supply systems of the digital module and the analog module interact with each other. In addition, data of equal intervals or a clock drives digital buffers in the conventional BMC transmitter, not only resulting in a large power supply switching noise, but also occupying a large chip area and consuming a large power.

The following technical solutions are provided according to the present disclosure.

A BMC transceiver is provided, which includes an operational amplifier circuit and a mode switching switch group. The operational amplifier circuit is configured to operate in a time division multiplexing manner. In a case where the BMC transceiver operates in a transmitting mode, the mode switching switch group is configured to configure the operational amplifier circuit as a BMC transmitter, to transmit to-be-transmitted data txd generated by a data encoding and protocol processing unit to a configuration channel (CC) through the operational amplifier circuit. In a case where the BMC transceiver operates in a receiving mode, the mode switching switch group is configured to configure the operational amplifier circuit as a BMC receiver, to receive BMC data transmitted by a downstream device of the CC channel and transmit the BMC data to the data encoding and protocol processing unit for processing. In the transmitting mode, a bias current of the operational amplifier circuit is changed, to change a charging/discharging speed of the operational amplifier circuit to a capacitor under a step input signal, so as to adjust rising/falling time of an output waveform.

In an embodiment, the operational amplifier circuit is a differential input differential output operational amplifier or a differential input single-ended output operational amplifier.

In an embodiment, the differential input differential output operational amplifier includes a positive input terminal, a negative input terminal, a positive output terminal and a negative output terminal. Input signals of the positive input terminal and the negative input terminal are connected to the to-be-transmitted data txd from the data encoding and protocol processing unit or to-be-received data transmitted by the downstream device of the CC channel. Output signals of the positive output terminal and the negative output terminal are connected to the CC channel or to-be-received data rxd of the data encoding and protocol processing unit.

In an embodiment, the mode switching switch group includes a first switch, a second switch, a third switch and a fourth switch. In a case where the BMC transceiver operates in the transmitting mode, the first switch and the third switch are turned on, and the second switch and the fourth switch are turned off, such that the positive input terminal of the operational amplifier is connected to the to-be-transmitted data txd from the data encoding and protocol processing unit, and the positive output terminal of the operational amplifier is connected to the negative input terminal of the operational amplifier, to form a unity gain buffer, for driving the CC channel to form a final BMC output waveform. In a case where the BMC transceiver operates in the receiving mode, the first switch and the third switch are turned off, and the second switch and the fourth switch are turned on, such that the negative input terminal of the operational amplifier is connected to the CC channel to receive BMC data transmitted by a downstream device, the negative output terminal of the operational amplifier is connected to the positive input terminal of the operational amplifier to form a unity gain buffer, for shaping the received input waveform and transmitting the shaped input waveform to the data encoding and protocol processing unit for processing.

In an embodiment, the differential input single-ended output operational amplifier includes a positive input terminal, a negative input terminal and a positive output terminal. Input signals of the positive input terminal and the negative input terminal are connected to the to-be-transmitted data txd from the data encoding and protocol processing unit or to-be-received data transmitted by a downstream device of the CC channel. Output signals of the positive output terminal are connected to the CC channel or to-be-received data rxd of the data encoding and protocol processing unit.

In an embodiment, the mode switching switch group includes a first switch, a second switch, a third switch and a fourth switch. In a case where the BMC transceiver operates in the transmitting mode, the first switch and the third switch are turned on, and the second switch and the fourth switch are turned off, such that the positive input terminal of the operational amplifier is connected to the to-be-transmitted data txd from the data encoding and protocol processing unit, and the positive output terminal of the operational amplifier is connected to the negative input terminal of the operational amplifier and is connected to the CC channel, to drive the CC channel to form a final BMC output waveform. In a case where the BMC transceiver operates in the receiving mode, the first switch and the third switch are turned off, the second switch and the fourth switch are turned on, such that the positive input terminal of the operational amplifier is connected to the CC channel to receive BMC data transmitted by a downstream device, the positive output terminal of the operational amplifier is connected to the negative input terminal of the operational amplifier and is connected to the to-be-received data rxd of the data encoding and protocol processing unit, for shaping the received input waveform and transmitting the shaped input waveform to the data encoding and protocol processing unit for processing.

It can be seen from the above technical solutions that, compared with the conventional technology, a BMC transceiver is provided according to the present disclosure, which includes an operational amplifier circuit and a mode switching switch group. The operational amplifier circuit is configured to operate in a time division multiplexing manner. In a case where the BMC transceiver operates in a transmitting mode, the mode switching switch group is configured to configure the operational amplifier circuit as a BMC transmitter, to transmit to-be-transmitted data txd generated by a data encoding and protocol processing unit to a configuration channel (CC) through the operational amplifier circuit. In a case where the BMC transceiver operates in a receiving mode, the mode switching switch group is configured to configure the operational amplifier circuit as a BMC receiver, to receive BMC data transmitted by a downstream device of the CC channel, and transmit the BMC data to the data encoding and protocol processing unit for processing. In the transmitting mode, a bias current of the operational amplifier circuit is changed, to change a charging/discharging speed of the operational amplifier circuit to a capacitor under a step input signal, so as to adjust rising/falling time of an output waveform. According to the present disclosure, an operational amplifier operating in a time division multiplexing manner is used. The operational amplifier is configured as a unity gain buffer, and it is determined whether the BMC transceiver operates as a transmitter or a receiver by selecting different input switches and output switches. In the transmitting mode, the bias current of the input differential pair transistor of the operational amplifier is changed, to change the slew rate, so as to obtain an output waveform with adjustable rising/falling edges of the transmitter, such that following problems in the conventional technology can be solved. The conventional BMC transmitter and the conventional BMC receiver are different in circuit natures, resulting in that power supply systems of the digital module and the analog module interact with each other. In addition, data of equal intervals or the clock drives digital buffers in the conventional BMC transmitter, not only resulting in a large power supply switching noise, but also occupying a large chip area and consuming a large power.

BRIEF DESCRIPTION OF THE DRAWINGS

In order to more clearly illustrate technical solutions in embodiments of the present disclosure or in the conventional technology, the drawings used to describe the embodiments or the conventional technology are briefly described hereinafter. It is apparent that the drawings in the following description show only some embodiments of the present disclosure, and other drawings may be obtained by those skilled in the art based on the drawings without any creative efforts.

DETAILED DESCRIPTION OF EMBODIMENTS

Technical solutions of embodiments of the present disclosure are clearly and completely described hereinafter in conjunction with the drawings of the embodiments of the present disclosure. It is apparent that the embodiments described in the following are only some embodiments of the present disclosure, rather than all embodiments. Based on the embodiments in the present disclosure, any other embodiments obtained by those skilled in the art without any creative efforts, fall within the scope of protection of the present disclosure.

Terminologies used in the specification are described as follows.

USB Type-C: USB Type-C is a newest USB interface formulated by the USB IF organization. USB Type-C has capabilities of forward and reverse plugging and supplying high power, and can support transmission of multiple video protocols such as DP, HDMI and MHL.

USB-PD: USB-PD is a USB power transmission and communication protocol formulated by the USB IF organization. USB-PD can support the transmission of powers up to 100 W (20V/5 A) between USB devices, and can change power supply/reception and data transmission/reception properties of a port. In addition, according to the USB-PD, communication with a USB cable can be performed to obtain properties of the cable.

CC: CC refers to a configuration channel and is a key channel newly added in the Type-C interface. The upstream and downstream communication may be performed via USB-PD message transmission through the CC to establish a USB connection, a forward and reverse plugging, as well as the establishment and management of a connection between data and VBUS.

Figure 4:
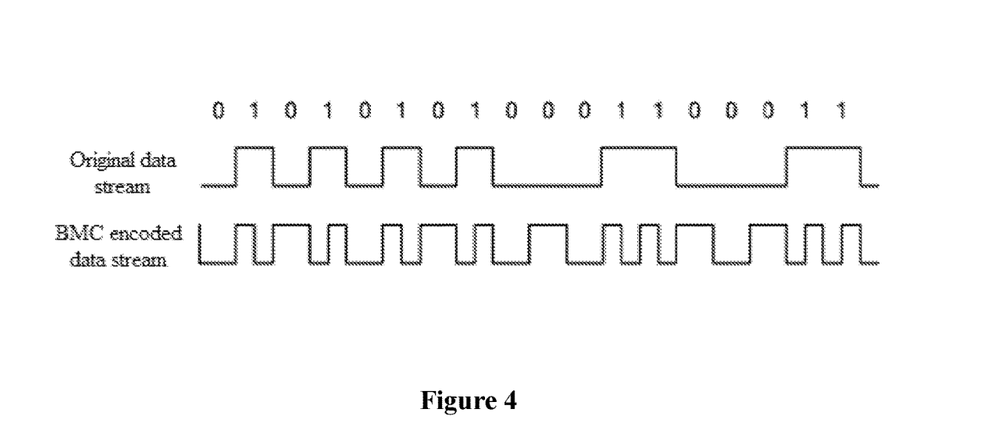
FIG. 4 is a schematic diagram of an output waveform and an input waveform of a conventional BMC transmitter according to the conventional technology.

BMC: BMC refers to Biphase Mark Coding and is a physical layer coding mechanism for transmitting USB-PD protocol messages, as shown in FIG. 4. BMC is characterized in that: there is a transition edge between two adjacent binary data bits, and there is also a transition edge at a middle position of data bit "1". The advantage of this coding mechanism is to provide a DC balance characteristic (the number of data bits "0" and the number of data bits "1" are substantially the same, and the DC level is almost 0).

UGB: UGB refers to a unity-gain buffer, that is, a follower. The UGB indicates an application manner of an operational amplifier in which the positive (negative) input terminal of the operational amplifier is used as the UGB signal input and the negative (positive) input terminal is connected with the positive (negative) output terminal of the operational amplifier to serve as UGB output. Since the operational amplifier itself generally has a high gain, UGB has advantages such as an output changing with an input, a small output impedance and a strong driving capability.

SR: SR refers to a slew rate. SR indicates a capability of an output signal of the operational amplifier to follow or respond to an input step signal and reflects a transient response capability of the operational amplifier. SR is expressed based on a change amount of the output voltage per µs, that is V/µs.

The USB Type-C interface is the newest USB interface standard formulated by the USB IF organization, to conform a developing trend of emerging consumption electronic platforms and further expand ecosystem requirements for USB cables and USB connectors. The USB Type-C interface is specifically customized for emerging products and has a smaller volume than the data charging interface USB 2.0 Micro-B commonly used in conventional mobile phones. In addition, the USB Type-C interface supports blind-plugging (a forward or reverse plugging, and an adjustable cable direction), supplies a higher charge power (up to 100 W @ 20V 5 A), and provides Alternate Mode for transmitting different video data, thereby expanding functions of the interface.

Figure 14:
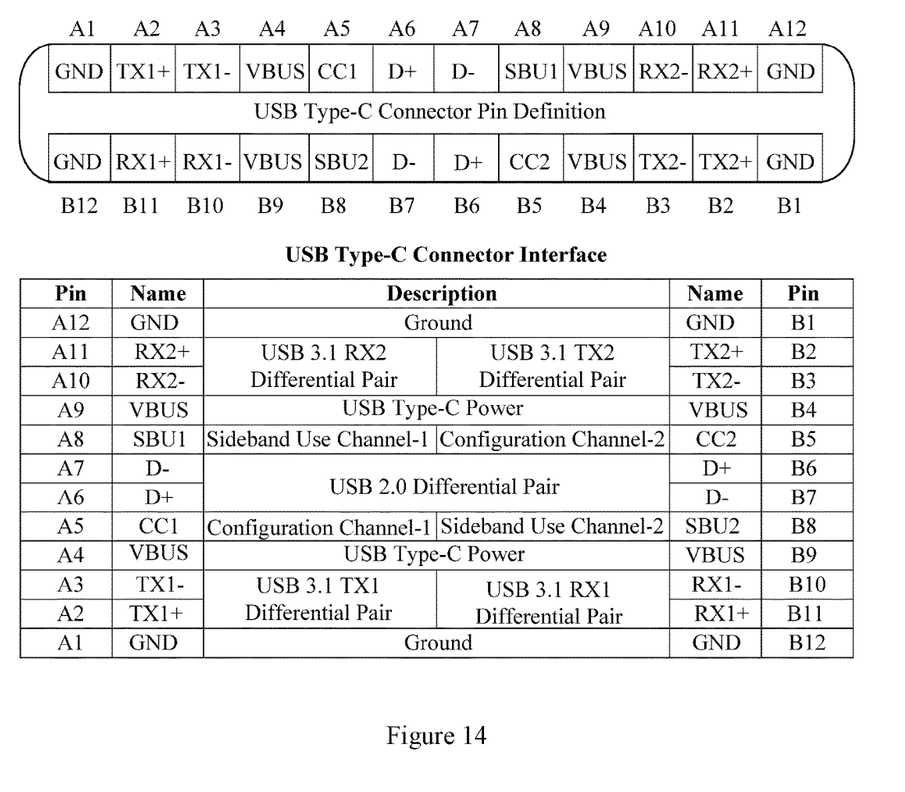
FIG. 14 and FIG. 15 show the definition and distribution of signals of the USB Type-C interface (including a socket and plug).
Figure 15:
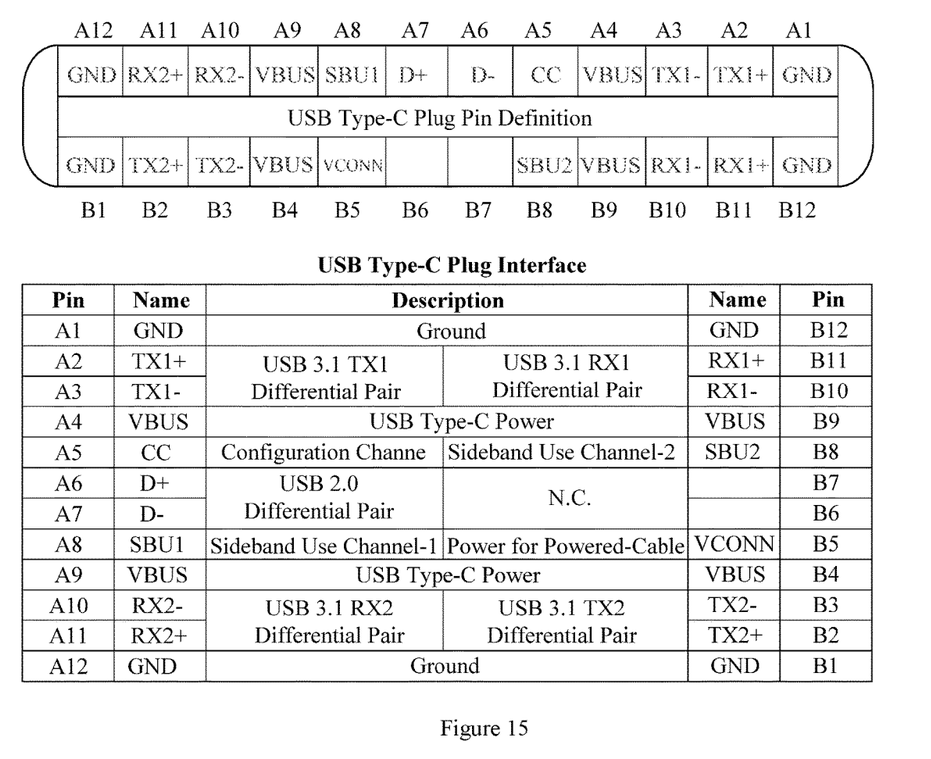

As shown in FIG. 14 and FIG. 15, the definition and distribution of signals of the USB Type-C interface (including a socket and a plug) are explained. Once the forward and reverse plugging direction is determined, it is determined whether CC1 or CC2 in the socket is connected with the CC in the plug for transmitting BMC encoded USB-PD protocol messages. The present disclosure relates only to the CC channel, and signals on other pins are not relevant to the present disclosure.

Figure 5:
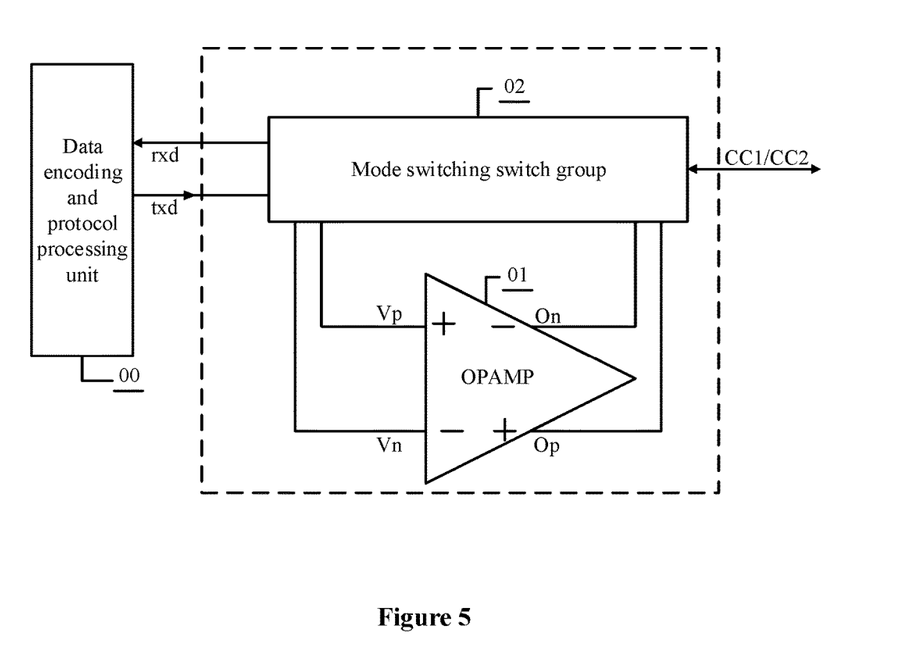
FIG. 5 is a schematic structural diagram of a BMC transceiver according to an embodiment of the present disclosure.

As shown in FIG. 5, a BMC transceiver is provided according to an embodiment of the present disclosure, which includes an operational amplifier circuit 01 and a mode switching switch group 02. The operational amplifier circuit 01 is configured to operate in a time division multiplexing manner.

In a case where the BMC transceiver operates in a transmitting mode, the mode switching switch group 02 is configured to configure the operational amplifier circuit 01 as a BMC transmitter, to transmit to-be-transmitted data txd generated by a data encoding and protocol processing unit 00 to the CC channel through the operational amplifier circuit 01.

In a case where the BMC transceiver operates in a receiving mode, the mode switching switch group 02 is configured to configure the operational amplifier circuit 01 as a BMC receiver, to receive BMC data transmitted by a downstream device of the CC channel and transmit the BMC data to the data encoding and protocol processing unit 00 for processing.

In the transmitting mode, a bias current of the operational amplifier circuit is changed, to change a charging/discharging speed of the operational amplifier circuit to a capacitor under a step input signal, so as to adjust rising/falling time of an output waveform.

In the BMC transceiver shown in FIG. 5, the operational amplifier circuit is configured to operate in a time-division multiplexing manner. In a case where the BMC transceiver operates in the transmitting mode, the mode switching switch group 02 is configured to configure the operational amplifier circuit 01 as a transmitter, to transmit the to-be-transmitted data txd generated by the data encoding and protocol processing unit 00 to the CC (CC1 or CC2) channel through the operational amplifier circuit 01. In a case where the BMC transceiver operates in the receiving mode, the mode switching switch group 02 is configured to configure the operational amplifier circuit 01 as a receiver, to receive the BMC data transmitted by a downstream device of the CC (CC1 or CC2) channel and transmit the BMC data to the data encoding and protocol processing unit 00 for processing. In the transmitting mode, the bias current of the operational amplifier circuit is changed, to change the charging/discharging speed of the operational amplifier circuit to a capacitor under a step input signal, so as to adjust the rising/falling time of the output waveform. With the operational amplifier operating in the time division multiplexing manner and the method of changing rising/falling time via a biased current of the operational amplifier, the circuit can be greatly simplified. It is only required to design the core operational amplifier circuit 01, and then connect the mode switching switch group 02 with the operational amplifier circuit 01, such that the BMC transceiver can be achieved. Compared with a conventional BMC transceiver, the BMC transceiver according to the present disclosure has a simple and single circuit, a low power consumption and a small power supply switching noise.

Figure 6:
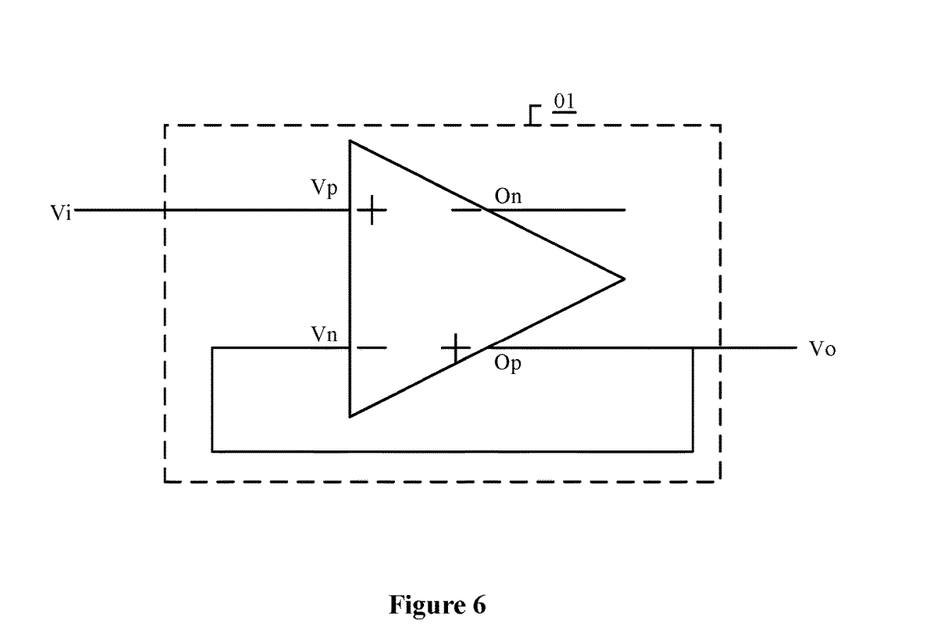
FIG. 6 is a schematic diagram of a connection mode in an implementation of an operational amplifier 01 according to an embodiment of the present disclosure.
Figure 7:
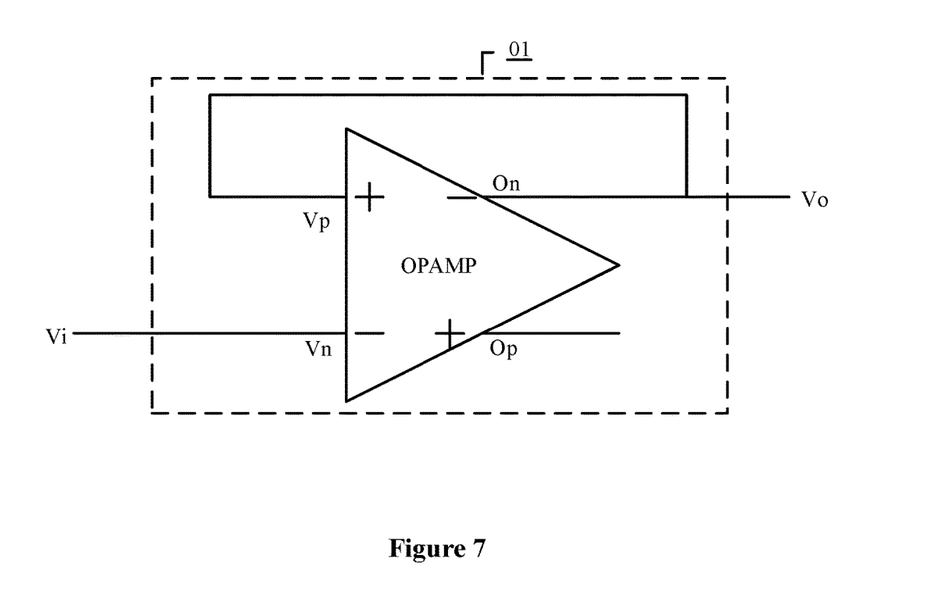
FIG. 7 is a schematic diagram of a connection mode in another implementation of an operational amplifier 01 according to an embodiment of the present disclosure.
Figure 8:
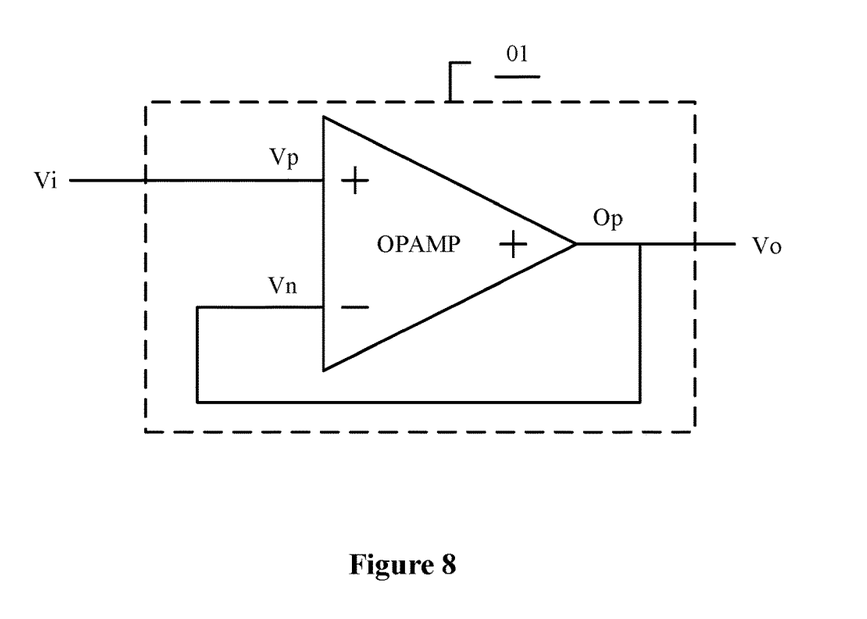
FIG. 8 is a schematic diagram of a connection mode in another implementation of an operational amplifier 01 according to an embodiment of the present disclosure.

In the embodiment of the present disclosure, it is to be noted that, as shown in FIG. 6, FIG. 7 and FIG. 8, the operational amplifier circuit may be a differential input differential output operational amplifier (FIG. 6 and FIG. 7) or a differential input single-ended output operational amplifier (FIG. 8).

As shown in FIG. 6 and FIG. 7, the differential input differential output operational amplifier 01 includes a positive input terminal Vp, a negative input terminal Vn, a positive output terminal Op and a negative output terminal On. Input signals of the positive input terminal Vp and the negative input terminal Vn are connected to the to-be-transmitted data txd from the data encoding and protocol processing unit 00 or to-be-received data rxd transmitted by a downstream device of the CC channel. Output signals of the positive output terminal Op and the negative output terminal On are connected to the CC channel or the to-be-received data rxd of the data encoding and protocol processing unit 00.

As shown in FIG. 8, the differential input single-ended output operational amplifier includes a positive input terminal Vp, a negative input terminal Vn and a positive output terminal Op. Input signals of the positive input terminal Vp and the negative input terminal Vn are connected to the to-be-transmitted data txd of the data encoding and protocol processing unit 00 or the to-be-received data rxd transmitted by a downstream device of the CC channel. Output signals of the positive output terminal Op are connected to the CC channel or the to-be-received data rxd of the data encoding and protocol processing unit 00.

Figure 9:
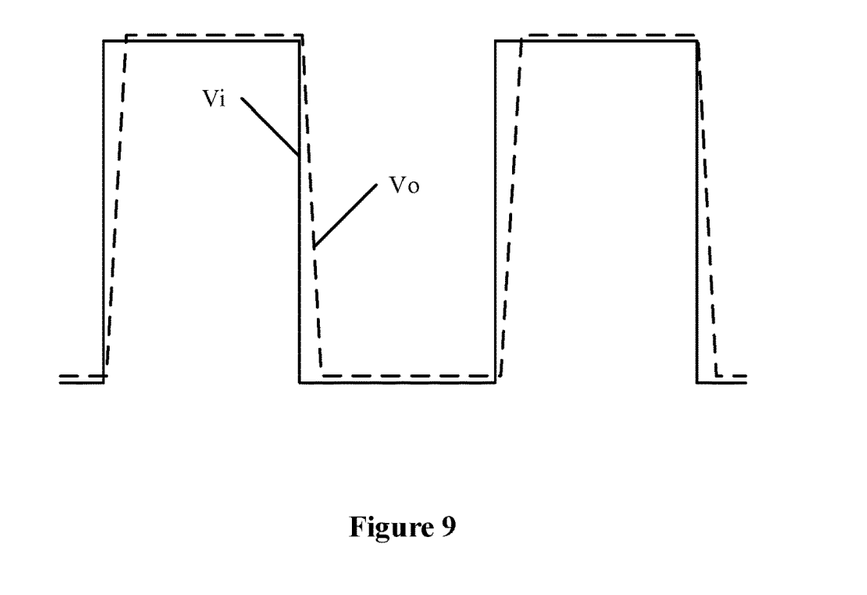
FIG. 9 is a schematic diagram of input and output step response waveforms of an operational amplifier 01 according to an embodiment of the present disclosure.

In the embodiment of the present disclosure, it is to be noted that the operational amplifier UGB has characteristics such as an output following an input, a small output impedance and a strong driving capability. FIG. 6 and FIG. 7 show two connection modes in a case where the differential input differential output operational amplifier is used, and FIG. 8 shows a connection mode in a case where the differential input single-ended output operational amplifier is used. The input-to-output gain of the operational amplifier may be expressed as: $A_{UGB}=Vo/Vi=A/(A+1)$, where A represents a gain of the operational amplifier. Since A is large (A is much larger than 1, and may be up to 100 or more), $A_{UGB}\approx1$, which exhibits a following characteristics. As shown in FIG. 9, FIG. 9 is a schematic diagram of input and output step response waveforms of an operational amplifier UGB according to an embodiment of the present disclosure.

Figure 10:
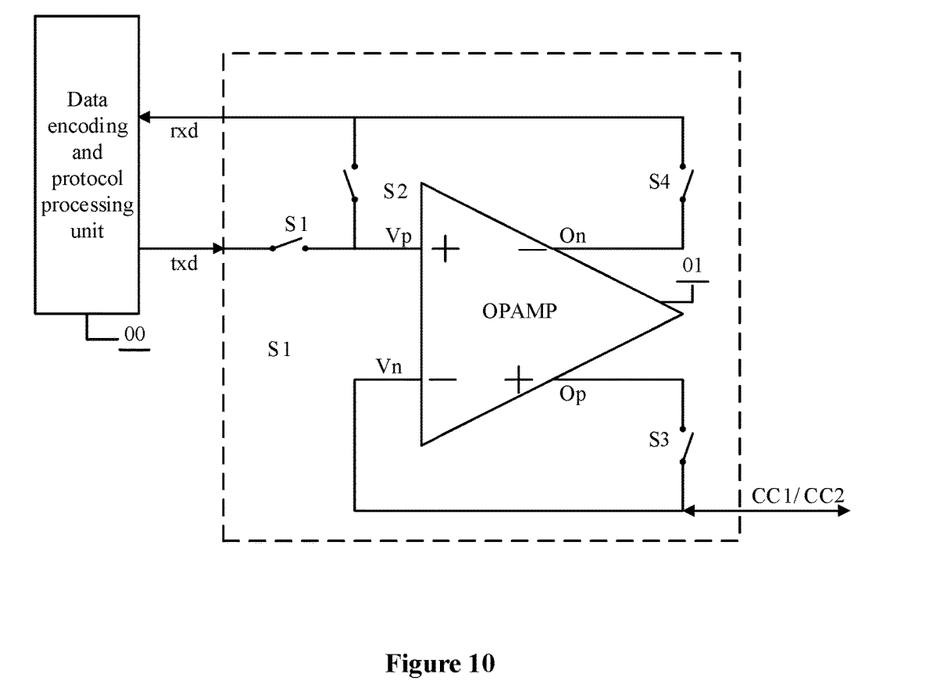
FIG. 10 is a schematic structural diagram of a BMC-I type transceiver according to an embodiment of the present disclosure.
Figure 11:
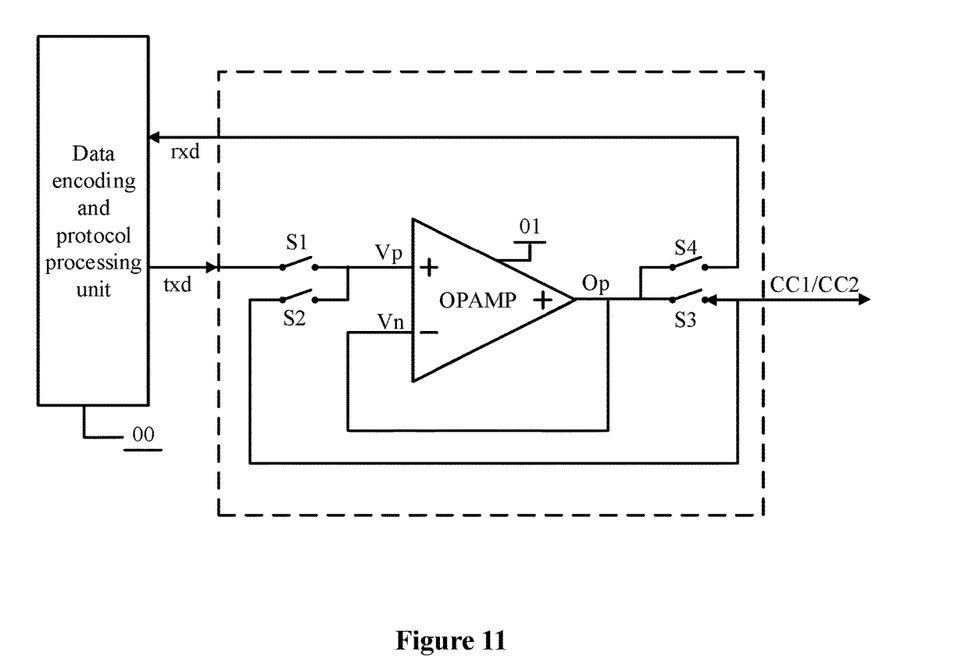
FIG. 11 is a schematic diagram of an operational amplifier 01 of a BMC-I type transceiver according to an embodiment of the present disclosure.

As shown in FIG. 10 and FIG. 11, the mode switching switch group 02 includes a first switch S1, a second switch S2, a third switch S3 and a fourth switch S4. For the differential input differential output operational amplifier 01 in FIG. 10, in a case where the BMC transceiver operates in the transmitting mode, the first switch S1 and the third switch S3 are turned on, and the second switch S2 and the fourth switch S4 are turned off, such that the positive input terminal Vp of the operational amplifier 01 is connected to the to-be-transmitted data txd from the data encoding and protocol processing unit 00, and the positive output terminal Op of the operational amplifier 01 is connected to the negative input terminal Vn of the operational amplifier 01 to form a unity gain buffer UGB, for driving the CC (CC1 or CC2) channel to form a final BMC output waveform. In a case where the BMC transceiver operates in the receiving mode, the first switch S1 and the third switch S3 are turned off, and the second switch S2 and the fourth switch S4 are turned on, such that the negative input terminal Vn of the operational amplifier 01 is connected to the CC (CC1 or CC2) channel to receive the BMC data transmitted by a downstream device, and the negative output terminal On of the operational amplifier 01 is connected to the positive input terminal Vp to form a unity gain buffer UGB, thereby shaping the received input waveform and transmitting the shaped input waveform to the data encoding and protocol processing unit 00 for processing.

For the differential input single-ended output operational amplifier in FIG. 11, in a case where the BMC transceiver operates in the transmitting mode, the first switch S1 and the third switch S3 are turned on, and the second switch S2 and the fourth switch S4 are turned off, such that the positive input terminal Vp of the operational amplifier 01 is connected to the to-be-transmitted data txd from the data encoding and protocol processing unit 00, and the positive output terminal Op of the operational amplifier 01 is connected to the negative input terminal Vn and is connected to the CC (CC1 or CC2) channel, to drive the CC (CC1 or CC2) channel to form a final BMC output waveform. In a case where the BMC transceiver operates in the receiving mode, the first switch S1 and the third switch S3 are turned off, and the second switch S2 and the fourth switch S4 are turned on, such that the positive input terminal Vp of the operational amplifier 01 is connected to the CC (CC1 or CC2) channel to receive the BMC data transmitted by a downstream device. The positive output terminal Op of the operational amplifier 01 is connected to the negative input terminal Vn, and is connected to the to-be-received data rxd of the data encoding and protocol processing unit 00, thereby shaping the received input waveform and transmit the shaped input waveform to the data encoding and protocol processing unit 00 for processing.

In the embodiments of the present disclosure, it is to be noted that, regardless of the type of the BMC transceiver, the BMC transceiver operates in the two operating modes alternately under the control of the data encoding and protocol processing unit 00, until the USB-PD communication on the CC (CC1 or CC2) channel is completed, and a connection is established between the upstream and downstream devices of the USB Type-C.

Figure 12:
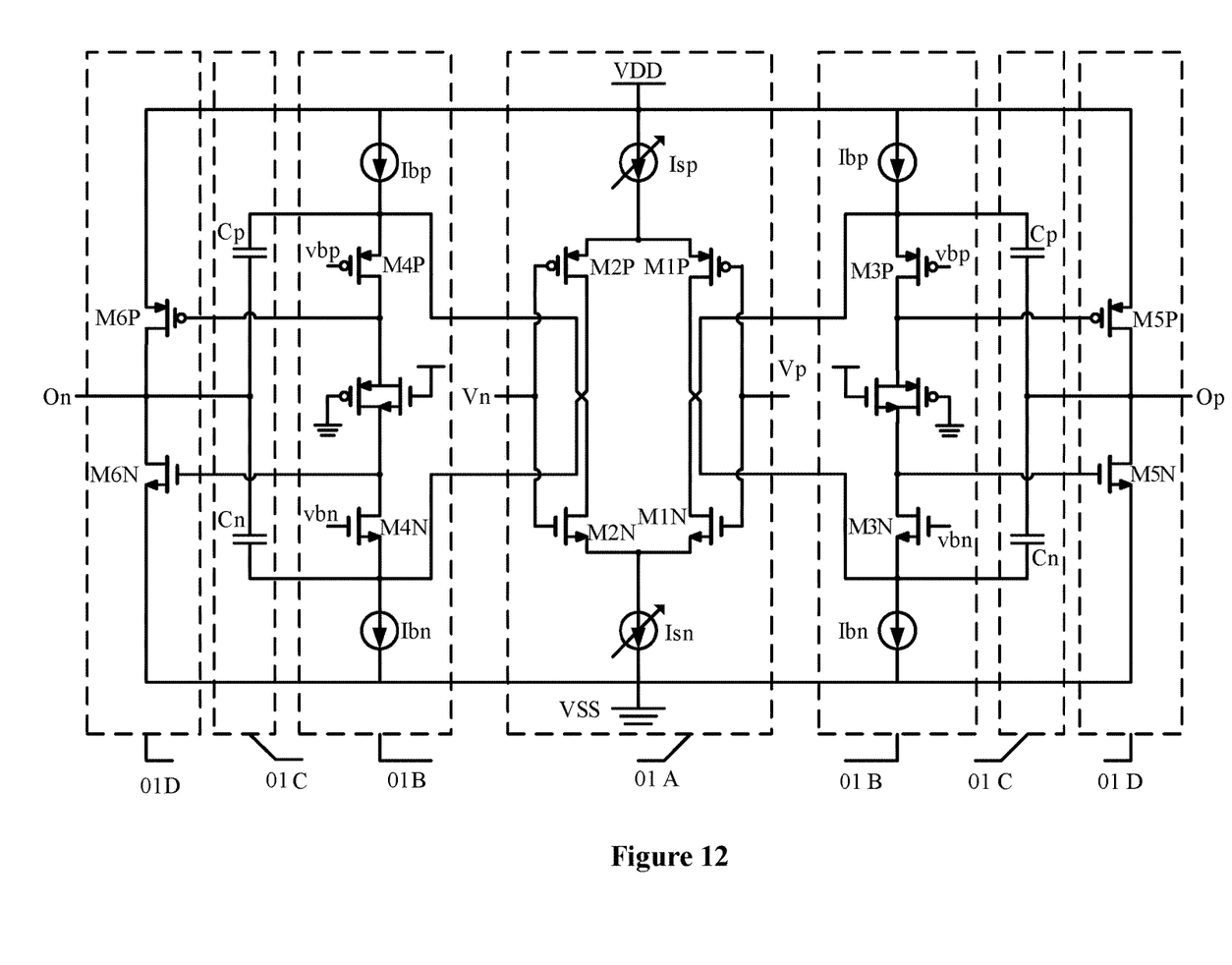
FIG. 12 is a schematic structural diagram of a BMC-II type transceiver according to an embodiment of the present disclosure.

The rising/falling time of the transmission waveform is adjusted as follows. As shown in FIG. 12, an internal circuit structure of a possible differential input differential output operational amplifier is shown. The circuit includes: a rail-to-rail input stage 01A, an amplification stage 01B, an output stage 01C and an operational amplifier stability compensating capacitor 01D. As shown in FIG. 12, Ibn and Ibp represent bias currents of the amplification stage 01B, and vbp and vbn represent bias voltages of the amplification stage Cascode transistors M3P/M4P and M3N/M4N. Isp and Isn represent bias currents of the input stage. By changing the magnitudes of the two currents, the slew rate of the unity gain buffer and the rising/failing edges of the finally transmitted waveform may be changed. According to the explanation of the principle of the operational amplifier slew rate, the following equation may be obtained: SR=(Isp+Isn)/(Cp+Cn).

Figure 13:
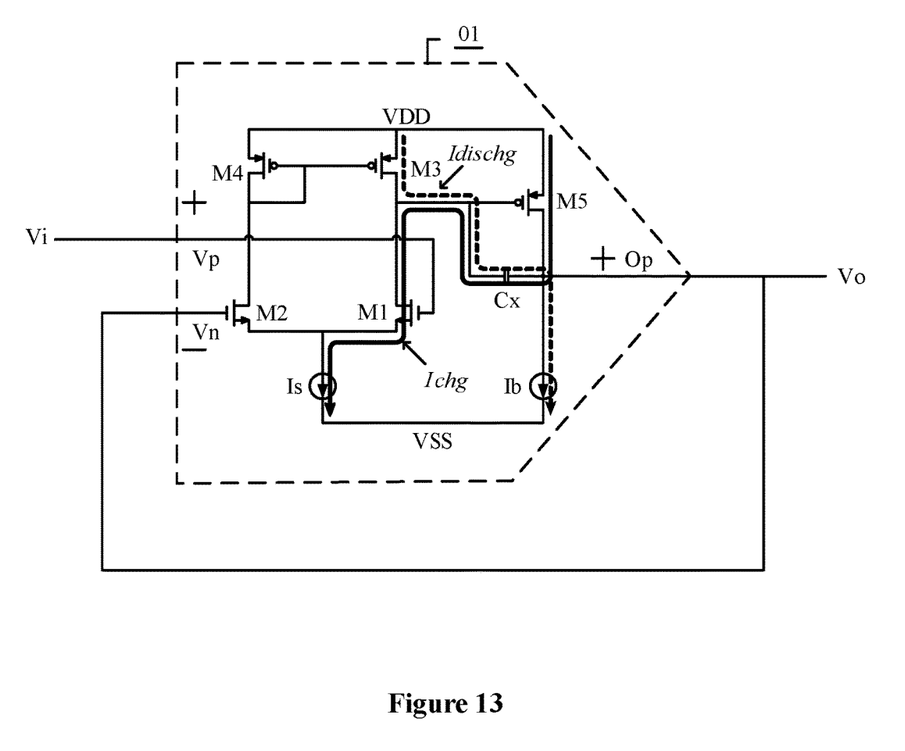
FIG. 13 is a schematic structural diagram showing a principle of an operational amplifier 01 according to an embodiment of the present disclosure.

As shown in FIG. 13, an internal circuit structure of a possible differential input single-ended output operational amplifier is shown. When a large positive step signal is inputted through an input Vi, M2, M3 and M4 are all turned off. In this case, as shown by a solid line in the figure, $T_{aw}$ flowing from VDD to VSS successively through M5, Cx, M1 and Is represents a forward charging current to Cx, and $I_{chg}=I_s$. The charging current charges Cx, such that the output voltage Vo is increased, thus a positive slew rate (a rising edge) of the output waveform is formed. When a large negative step signal is inputted through the input Vi, M1 is turned off, and M2 and M4 are turned on. In this case, as shown by a dashed line in the figure, $I_{dischg}$ flowing from VDD to VSS successively through M3, Cx and Ib represents a reverse charging current to Cx. Since $I_{dischg}$ is mirror current of $I_s$ flowing to M3 through M2 and M4, therefore $I_{dischg}=I_s$. The reverse charging current charges Cx reversely, such that the output voltage Vo is decreased, thus a negative slew rate (a falling edge) of the output waveform is formed. For the SR of operational amplifiers with other structures, although the analysis process may be different, the principles are the same, and the formula of the final slew rate is expressed as: $SR=I_s/Cx$.

A BMC transceiver is provided according to the embodiment of the present disclosure, which includes an operational amplifier circuit and a mode switching switch group. The operational amplifier circuit is configured to operate in a time division multiplexing manner. In a case where the BMC transceiver operates in a transmitting mode, the mode switching switch group is configured to configure the operational amplifier circuit as a BMC transmitter, to transmit to-be-transmitted data txd generated by a data encoding and protocol processing unit to a configuration channel (CC) through the operational amplifier circuit. In a case where the BMC transceiver operates in a receiving mode, the mode switching switch group is configured to configure the operational amplifier circuit as a BMC receiver, to receive BMC data transmitted by a downstream device of the CC channel, and transmit the BMC data to the data encoding and protocol processing unit for processing. In the transmitting mode, a bias current of the operational amplifier circuit is changed, to change a charging/discharging speed of the operational amplifier circuit to a capacitor under a step input signal, so as to adjust rising/falling time of an output waveform. According to the present disclosure, an operational amplifier operating in a time division multiplexing manner is used. The operational amplifier is configured as a unity gain buffer, and it is determined whether the BMC transceiver operates as a transmitter or a receiver by selecting different input switches and output switches. In the transmitting mode, the bias current of the input differential pair transistor of the operational amplifier is changed, to change the slew rate, so as to obtain an output waveform with adjustable rising/falling edges of the transmitter, such that following problems in the conventional technology can be solved. The conventional BMC transmitter and the conventional BMC receiver are different in circuit properties, thereby resulting in that power supply systems of the digital module and the analog module interact with each other. In addition, data of equal intervals or the clock drives digital buffers in the conventional BMC transmitter, not only resulting in a large power supply switching noise, but also occupying a large chip area and consuming a large power.

It should be further noted that the relationship terminologies such as "first", "second" and the like are only used herein to distinguish one entity or operation from another, rather than to necessitate or imply that the actual relationship or order exists between the entities or operations. Moreover, terms "comprising", "including", or any other variant thereof are intended to be inclusive, such that articles or devices that include a series of elements include not only those elements but also elements that are not explicitly listed or other elements that are inherent to such articles or devices. Unless expressively limited, the statement "including a . . . " does not exclude the case that other similar elements may exist in the article or the device other than enumerated elements.

The above illustration of the disclosed embodiments enables those skilled in the art to implement or practice the present disclosure. Various modifications to the embodiments are apparent to the person skilled in the art, and the general principle defined herein can be implemented in other embodiments without departing from the spirit or scope of the present disclosure. Therefore, the present disclosure is not limited to the embodiments described herein, but should conform to the broadest scope consistent with the principle and novel features disclosed herein.

The invention claimed is:

1. A biphase mark coding (BMC) transceiver, comprising an operational amplifier circuit and a mode switching switch group, wherein the operational amplifier circuit is configured to operate in a time division multiplexing manner, and wherein in a case where the BMC transceiver operates in a transmitting mode, the mode switching switch group is configured to configure the operational amplifier circuit as a BMC transmitter, to transmit to-be-transmitted data txd generated by a data encoding and protocol processing unit to a configuration channel (CC) through the operational amplifier circuit; and in a case where the BMC transceiver operates in a receiving mode, the mode switching switch group is configured to configure the operational amplifier circuit as a BMC receiver, to receive BMC data transmitted by a downstream device of the CC channel and transmit the BMC data to the data encoding and protocol processing unit for processing, wherein in the transmitting mode, a bias current of the operational amplifier circuit is changed, to change a charging/discharging speed of the operational amplifier circuit to a capacitor under a step input signal, so as to adjust rising/falling time of an output waveform.

2. The BMC transceiver according to claim 1, wherein the operational amplifier circuit is a differential input differential output operational amplifier or a differential input single-ended output operational amplifier.

3. The BMC transceiver according to claim 2, wherein the differential input differential output operational amplifier comprises a positive input terminal, a negative input terminal, a positive output terminal and a negative output terminal, and wherein
- input signals of the positive input terminal and the negative input terminal are connected to the to-be-transmitted data txd from the data encoding and protocol processing unit or to-be-received data transmitted by the downstream device of the CC channel; and
- output signals of the positive output terminal and the negative output terminal are connected to the CC channel or to-be-received data rxd of the data encoding and protocol processing unit.

4. The BMC transceiver according to claim 3, wherein the mode switching switch group comprises a first switch, a second switch, a third switch and a fourth switch, and wherein
- in a case where the BMC transceiver operates in the transmitting mode, the first switch and the third switch are turned on, and the second switch and the fourth switch are turned off, wherein the positive input terminal of the operational amplifier is connected to the to-be-transmitted data txd from the data encoding and protocol processing unit, and the positive output terminal of the operational amplifier is connected to the negative input terminal of the operational amplifier, to form a unity gain buffer, for driving the CC channel to form a final BMC output waveform; and
- in a case where the BMC transceiver operates in the receiving mode, the first switch and the third switch are turned off, and the second switch and the fourth switch are turned on, wherein the negative input terminal of the operational amplifier is connected to the CC channel to receive BMC data transmitted by a downstream device, the negative output terminal of the operational amplifier is connected to the positive input terminal to form a unity gain buffer, for shaping the received input waveform and transmitting the shaped input waveform to the data encoding and protocol processing unit for processing.

5. The BMC transceiver according to claim 2, wherein the differential input single-ended output operational amplifier comprises a positive input terminal, a negative input terminal and a positive output terminal, and wherein
- input signals of the positive input terminal and the negative input terminal are connected to the to-be-transmitted data txd from the data encoding and protocol processing unit or to-be-received data transmitted by a downstream device of the CC channel; and
- output signals of the positive output terminal are connected to the CC channel or to-be-received data rxd of the data encoding and protocol processing unit.

6. The BMC transceiver according to claim 5, wherein the mode switching switch group comprises a first switch, a second switch, a third switch and a fourth switch, and wherein
- in a case where the BMC transceiver operates in the transmitting mode, the first switch and the third switch are turned on, and the second switch and the fourth switch are turned off, wherein the positive input terminal of the operational amplifier is connected to the to-be-transmitted data txd from the data encoding and protocol processing unit, and the positive output terminal of the operational amplifier is connected to the negative input terminal of the operational amplifier and is connected to the CC channel, to drive the CC channel to form a final BMC output waveform; and
- in a case where the BMC transceiver operates in the receiving mode, the first switch and the third switch are turned off, and the second switch and the fourth switch are turned on, wherein the positive input terminal of the operational amplifier is connected to the CC channel to receive BMC data transmitted by a downstream device, the positive output terminal of the operational amplifier is connected to the negative input terminal of the operational amplifier and is connected to the to-be-received data rxd of the data encoding and protocol processing unit, for shaping the received input waveform and transmitting the shaped input waveform to the data encoding and protocol processing unit for processing.

* * * * *